United States Patent
Zhang

(10) Patent No.: US 11,901,028 B2
(45) Date of Patent: *Feb. 13, 2024

(54) DATA TRANSMISSION CIRCUIT, DATA TRANSMISSION METHOD, AND STORAGE APPARATUS

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefel (CN)

( * ) Notice: Subject to any disclaimer, the term of this patent is extended or adjusted under 35 U.S.C. 154(b) by 73 days.

This patent is subject to a terminal disclaimer.

(21) Appl. No.: 17/717,159

(22) Filed: Apr. 11, 2022

(65) Prior Publication Data

US 2022/0328120 A1 Oct. 13, 2022

Related U.S. Application Data

(63) Continuation of application No. PCT/CN2021/120526, filed on Sep. 26, 2021.

(30) Foreign Application Priority Data

Apr. 13, 2021 (CN) .......................... 202110395656.8

(51) Int. Cl.
*G11C 29/42* (2006.01)
*G11C 29/44* (2006.01)
*H03K 19/20* (2006.01)
*G11C 7/10* (2006.01)

(52) U.S. Cl.
CPC ............ *G11C 29/42* (2013.01); *G11C 7/1069* (2013.01); *G11C 7/1096* (2013.01); *G11C 29/4401* (2013.01); *H03K 19/20* (2013.01)

(58) Field of Classification Search
CPC ..... G11C 29/42; G11C 7/1069; G11C 7/1096; G11C 29/4401; G11C 7/02; G11C 7/1006; G11C 7/1048; H03K 19/20
(Continued)

(56) References Cited

U.S. PATENT DOCUMENTS 11,113,218 B1 * 9/2021 Yamanaka ............ H04L 1/0061
2009/0276688 A1 * 11/2009 Yoshida ................ H03M 13/09
714/699

(Continued)

FOREIGN PATENT DOCUMENTS

CN 1551242 A 12/2004
CN 101667451 A 3/2010
(Continued)

OTHER PUBLICATIONS

United States Patent and Trademark Office, Non-final office action received in related U.S. Appl. No. 17/715,943 dated May 25, 2023.

*Primary Examiner* — Shelly A Chase
*Assistant Examiner* — Osman M Alshack
(74) *Attorney, Agent, or Firm* — Kilpatrick Townsend & Stockton LLP

(57) ABSTRACT

A data transmission circuit, a data transmission method, and a storage apparatus are provided. The data transmission circuit includes a check circuit, a comparison circuit, and a data conversion circuit. The check circuit is configured to generate check code data according to first data on a first data line, and combine the first data and the check code data into second data. The comparison circuit is configured to receive the second data and third data on the second data line, and compare the second data with the third data to output a comparison result indicating whether number of different bits between the second data and the third data exceeds a preset threshold. The data conversion circuit is configured to invert the second data and transmit the
(Continued)

Generate check code data according to first data on a first data line, wherein the first data and the check code data are combined into second data — 102

Compare the second data with third data on a second data line, to output a comparison result indicating whether number of different bits between the second data and the third data exceeds a preset threshold, wherein the second data and the third data have the same preset bit width — 104

Invert the second data and transmit the inverted second data to the second data line when the comparison result is indicative of exceeding the preset threshold, and transmit the second data to the second data line when the comparison result is indicative of not exceeding the preset threshold — 106 inverted second data to the second data line when the comparison result is indicative of exceeding the preset threshold.

15 Claims, 6 Drawing Sheets

(58) Field of Classification Search
USPC .................................. 714/719, 750, 752, 764
See application file for complete search history.

(56) References Cited

U.S. PATENT DOCUMENTS

| | | |
|---|---|---|
| 2011/0035644 A1 | 2/2011 | Madan |
| 2011/0280296 A1* | 11/2011 | Wang .................. H04L 1/20 375/262 |
| 2016/0225417 A1* | 8/2016 | Lim .................... G11C 7/18 |
| 2020/0341869 A1* | 10/2020 | Langadi ............ G06F 11/1044 |
| 2022/0310139 A1 | 9/2022 | Zhang |

FOREIGN PATENT DOCUMENTS

| | | |
|---|---|---|
| CN | 103780506 A | 5/2014 |
| CN | 105634504 A | 6/2016 |
| CN | 107222298 A | 9/2017 |
| CN | 109036240 A | 12/2018 |
| CN | 210667806 U | 6/2020 |
| CN | 211404066 U | 9/2020 |
| CN | 111951855 A | 11/2020 |
| CN | 112309484 A | 2/2021 |
| WO | 2019127350 A1 | 7/2019 |

* cited by examiner

DATA TRANSMISSION CIRCUIT, DATA TRANSMISSION METHOD, AND STORAGE APPARATUS

CROSS-REFERENCE TO RELATED APPLICATION

This application is a continuation of PCT/CN2021/120526, filed on Sep. 26, 2021, which claims priority to Chinese Patent Application No. 202110395656.8 titled "DATA TRANSMISSION CIRCUIT, DATA TRANSMISSION METHOD, AND STORAGE APPARATUS" and filed on Apr. 13, 2021, the entire contents of which are incorporated herein by reference.

BACKGROUND

With the rapid development of semiconductor technologies, the market has higher and higher requirements for storage capacity and power-saving performance of a semiconductor storage apparatus, which puts forward higher requirements for various performance parameters of a peripheral circuit region and a storage array region in the semiconductor storage apparatus.

However, increase of density and number of memory cells in memory cell arrays has led to increase of length of data transmission path in a storage array region, which increases proportion of power consumption of the data transmission path to power consumption of a semiconductor storage apparatus, and increases probability of occurrence of an exception in data transmission.

How to effectively reduce the power consumption of the data transmission path in the storage array region and improve accuracy of data transmission has become one of technical problems to be solved urgently in the process of further improving storage performance of the semiconductor storage apparatus.

SUMMARY

The present disclosure relates to the field of semiconductor storage technologies, and more particularly, to a data transmission circuit, a data transmission method, and a storage apparatus.

A first aspect of the present disclosure provides a data transmission circuit, which includes a check circuit, a comparison circuit, and a data conversion circuit. The check circuit is configured to generate check code data according to first data on a first data line, and combine the first data and the check code data into second data. The comparison circuit is electrically connected to the first data line, the check circuit, and the second data line. The comparison circuit is configured to receive the second data and third data on the second data line, and compare the second data with the third data to output a comparison result indicating whether number of different bits between the second data and the third data exceeds a preset threshold, wherein the second data and the third data have a same preset bit width. The data conversion circuit is electrically connected to the check circuit, the comparison circuit, and the second data line. The data conversion circuit is configured to invert the second data and transmit the inverted second data to the second data line when the comparison result is indicative of exceeding the preset threshold, and transmit the second data to the second data line when the comparison result is indicative of not exceeding the preset threshold.

A second aspect of the present disclosure provides a storage apparatus, which includes the above-mentioned data transmission circuit and is configured to store and transmit data of a read operation or a write operation.

A third aspect of the present disclosure provides a data transmission method, comprising: generating check code data according to first data on a first data line, wherein the first data and the check code data are combined into second data; comparing the second data with third data on a second data line, to output a comparison result indicating whether number of different bits between the second data and the third data exceeds a preset threshold, wherein the second data and the third data have the same preset bit width; and inverting the second data and transmitting the inverted second data to the second data line when the comparison result is indicative of exceeding the preset threshold, and transmitting the second data to the second data line when the comparison result is indicative of not exceeding the preset threshold.

Details of each embodiment of the present disclosure will be described in the following drawings and descriptions. Based on the specification, drawings and claims, those skilled in the art will easily understand other features, problems to be solved, and technical effects of the present disclosure.

BRIEF DESCRIPTION OF THE DRAWINGS

To describe the technical solutions of the embodiments of the present disclosure more clearly, the accompanying drawings required for describing the embodiments will be briefly introduced below. Additional details or examples used for describing the accompanying drawings should not be considered as a limitation on the scope of any one of invention and creation of the present disclosure, and the currently described embodiments or implementations.

FIG. 5b is a schematic diagram of an implementation of FIG. 5a;

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure. In addition, certain terms used throughout the specification and the following claims refer to particular components. Those skilled in the art will understand that manufacturers may represent components with different names. This document does not intend to distinguish between components with different names but the same functions. In the following description and embodiments, the terms "including" and "comprising" are used in an open-ended fashion, and thus should be interpreted as "including, but not limited to . . . ". Likewise, the term "connection" is intended to express an indirect or direct electrical connection. Correspondingly, if one device is connected to another device, the connection between the two devices may be achieved by means of a direct electrical connection, or by means of an indirect electrical connection of other devices and connectors.

It should be understood that although terms such as "first", "second" and the like may be used herein to describe various components, these components should not be limited by these terms. These terms are only intended to distinguish one component from another one. For example, a first component may be termed a second component, and similarly, a second component may be termed a first component, without departing from the scope of the present disclosure.

Figure 1:
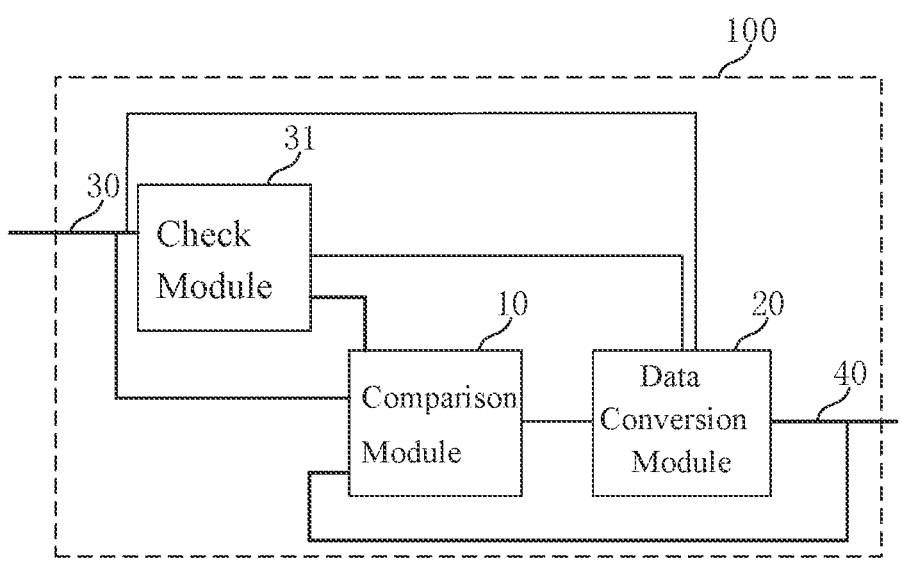
FIG. 1 is a schematic diagram showing a circuit principle of a data transmission circuit according to a first embodiment of the present disclosure.

With reference to FIG. 1, in one embodiment of the present disclosure, there is provided a data transmission circuit 100, which includes a comparison circuit 10, a data conversion circuit 20, and a check circuit 31. The check circuit 31 is configured to generate check code data according to first data on a first data line 30, and combine the first data and the check code data into second data. The comparison circuit 10 is electrically connected to the first data line 30, the check circuit 31, and a second data line 40. The comparison circuit 10 is configured to receive the second data and third data on the second data line 40, and compare the second data with the third data to output a comparison result indicating whether number of different bits between the second data and the third data exceeds a preset threshold, wherein the second data and the third data have a same preset bit width. The data conversion circuit 20 is electrically connected to the first data line 30, the check circuit 31, the comparison circuit 10, and the second data line 40. The data conversion circuit 20 is configured to invert the second data and transmit the inverted second data to the second data line 40 when the comparison result is indicative of exceeding the preset threshold, and transmit the second data to the second data line 40 when the comparison result is indicative of not exceeding the preset threshold.

With continued reference to FIG. 1, the check circuit 31 is arranged to check first data on the first data line 30 to generate check code data, and combine the first data and the check code data into second data, such that the second data are transmitted to a next-stage data line. The comparison circuit 10 is arranged to compare the second data with third data on the second data line 40 to output a comparison result indicating whether number of different bits between the second data and the third data exceeds a preset threshold, wherein the second data and the third data have the same preset bit width. The data conversion circuit 20 is arranged to invert the second data and transmit the inverted second data to the second data line 40 when the comparison result is indicative of exceeding the preset threshold, and transmit the second data to the second data line 40 when the comparison result is indicative of not exceeding the preset threshold. The preset threshold may be set to half of the preset bit width. This power-saving algorithm in this embodiment can reduce number of inversions of write data under the premise of ensuring transmission accuracy of the write data, and also effectively reduce power consumption in a transmission process of the write data. Therefore, the data transmission accuracy can be improved while reducing the power consumption in a data writing process without changing a data transmission path length. In this embodiment, before this power-saving algorithm is applied, the first data on the first data line 30 are prechecked and check code data are generated, and subsequently the check code data are stored in a memory cell, such that data are checked when the data are to be read, to prevent adverse effects caused by data errors occurring when the second data are inverted in the process of using this power-saving algorithm. In this way, reliability in the data writing process or data storage process can also be ensured while reducing the power consumption.

As an example, with continued reference to FIG. 1, in one embodiment of the present disclosure, the check circuit 31 includes an error correction coding (ECC) subcircuit (not shown), wherein the ECC subcircuit checks the first data on the first data line 30 such as a data bus, and generates an ECC check code, to subsequently perform error detection and/or error correction on the read data according to the ECC check code. In this way, reliability of the data can be ensured when the power-saving algorithm of this embodiment is applied. The data bus here is intended to exemplarily illustrate that the first data line 30 serves as a previous-stage data transmission line of the second data line 40, and is not intended to limit the present disclosure.

Figure 2:
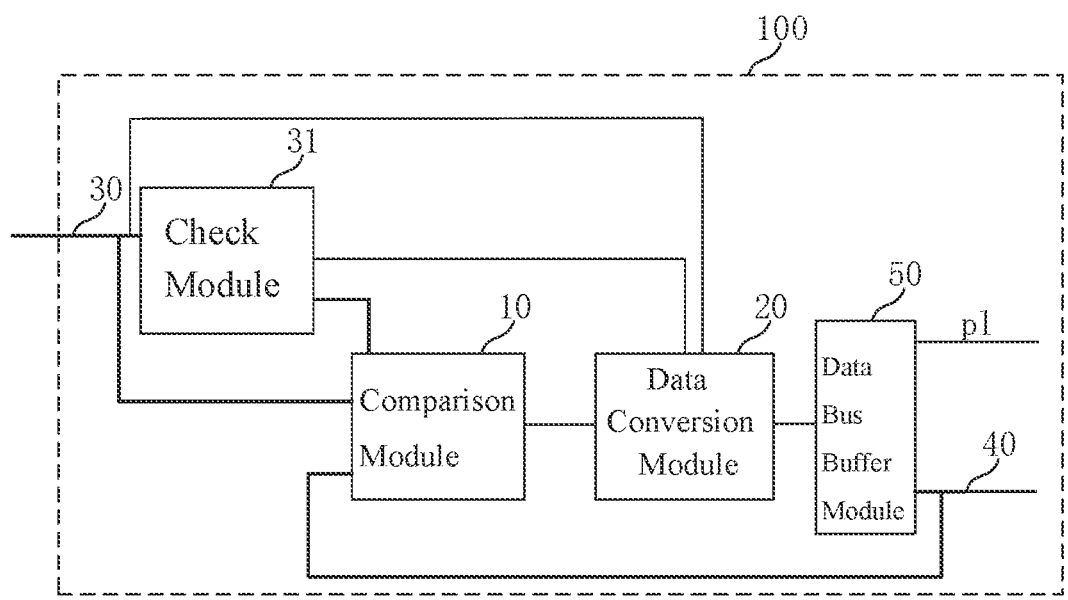
FIG. 2 is a schematic diagram showing a circuit principle of a data transmission circuit according to a second embodiment of the present disclosure.

Referring to FIG. 2, in one embodiment of the present disclosure, the data transmission circuit 100 further includes a data bus buffer circuit 50, wherein the data bus buffer circuit 50 is electrically connected to the data conversion circuit 20, the comparison circuit 10, and the second data line 40. The data bus buffer circuit 50 is configured to generate a data polarity identification signal pl according to the comparison result, and is also configured to transmit the second data or the inverted second data to the second data line 40, such that a next-stage circuit can restore the previously inverted data according to the data polarity identification signal pl, thereby ensuring accuracy of writing the data to a storage array region.

Figure 3:
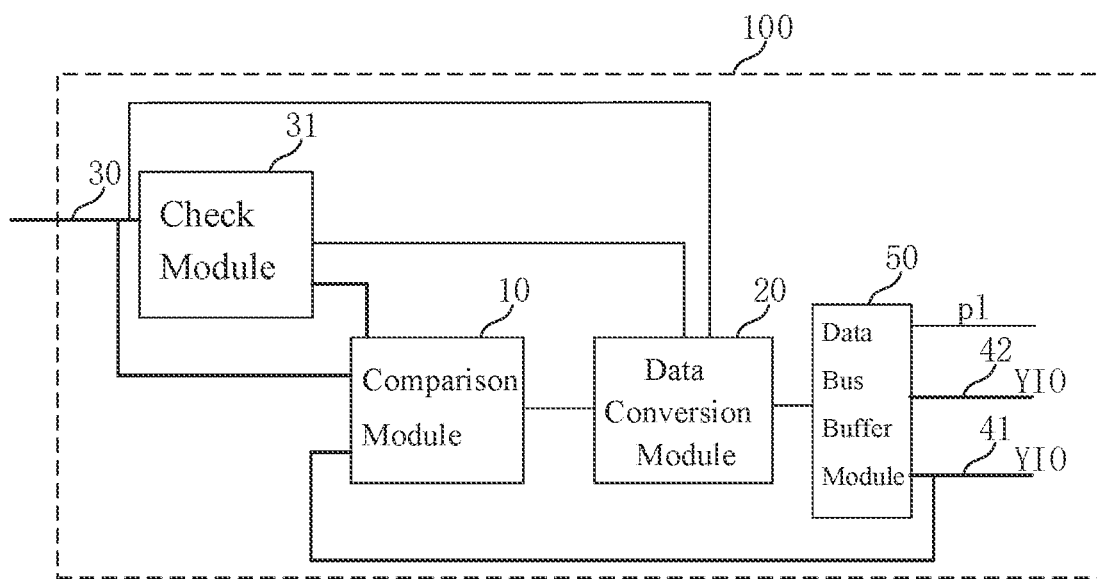
FIG. 3 is a schematic diagram showing a circuit principle of a data transmission circuit according to a third embodiment of the present disclosure.

With reference to FIG. 3, in one embodiment of the present disclosure, the second data line 40 includes a global data line 41 and a complementary global data line 42, wherein the global data line 41 and the complementary global data line 42 are configured to transmit signals mutually inverted in phase.

The inverting the second data and transmitting the inverted second data to the second data line 40 includes:

inverting the second data and transmitting the inverted second data to the global data line YIO.

The transmitting the second data to the second data line 40 comprises:

transmitting the second data to the global data line YIO.

As an example, with continued reference to FIG. 3, the second data line 40 includes the global data line 41 and the complementary global data line 42, wherein the global data line 41 and the complementary global data line 42 are configured to transmit signals mutually inverted in phase. In this way, cross reference may be made to data transmitted by the global data line 41 and data transmitted by the complementary global data line 42, to further improve the accuracy of transmitting the data to a next-stage data line.

Figure 4:
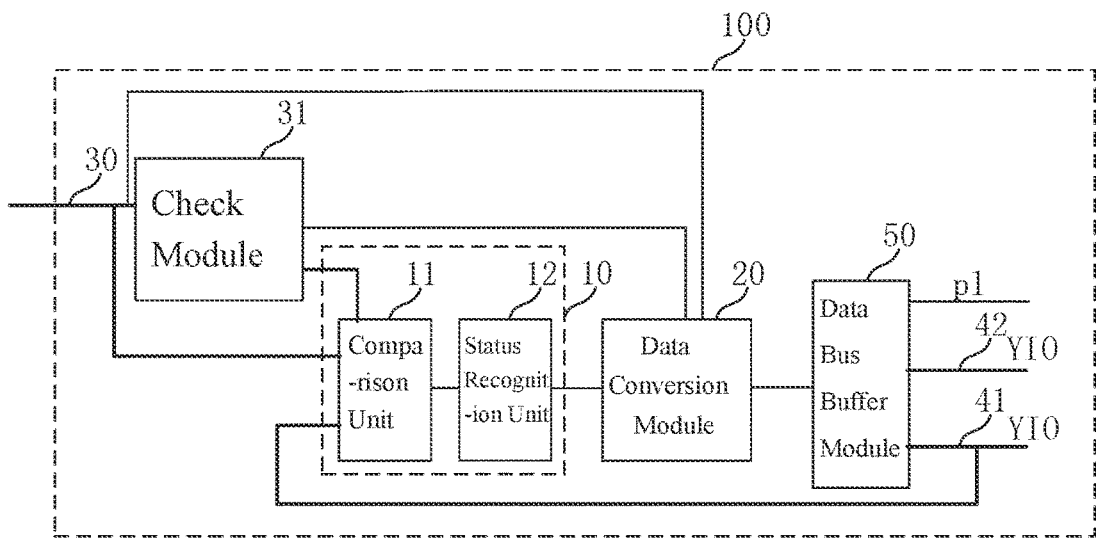
FIG. 4 is a schematic diagram showing a circuit principle of a data transmission circuit according to a fourth embodiment of the present disclosure.

With reference to FIG. 4, in one embodiment of the present disclosure, the comparison circuit 10 includes a comparison subcircuit 11 and a status recognition subcircuit 12. The comparison subcircuit 11 is configured to compare the second data and the third data bit by bit, and output comparison status data of each bit. The status recognition subcircuit 12 is electrically connected to the comparison subcircuit 11, and is configured to perform statistics on the comparison status data of each bit, and output the comparison result according to a statistical result.

Figure 5A:
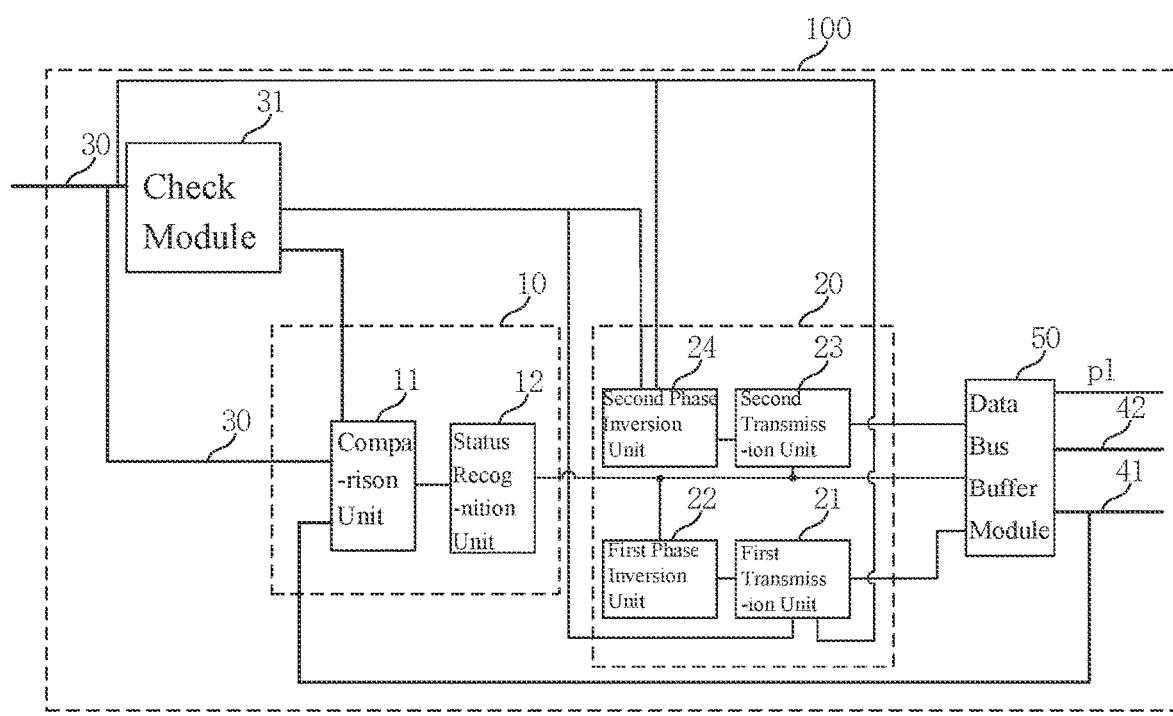
FIG. 5a is a schematic diagram showing a circuit principle of a data transmission circuit according to a fifth embodiment of the present disclosure.
Figure 5B:
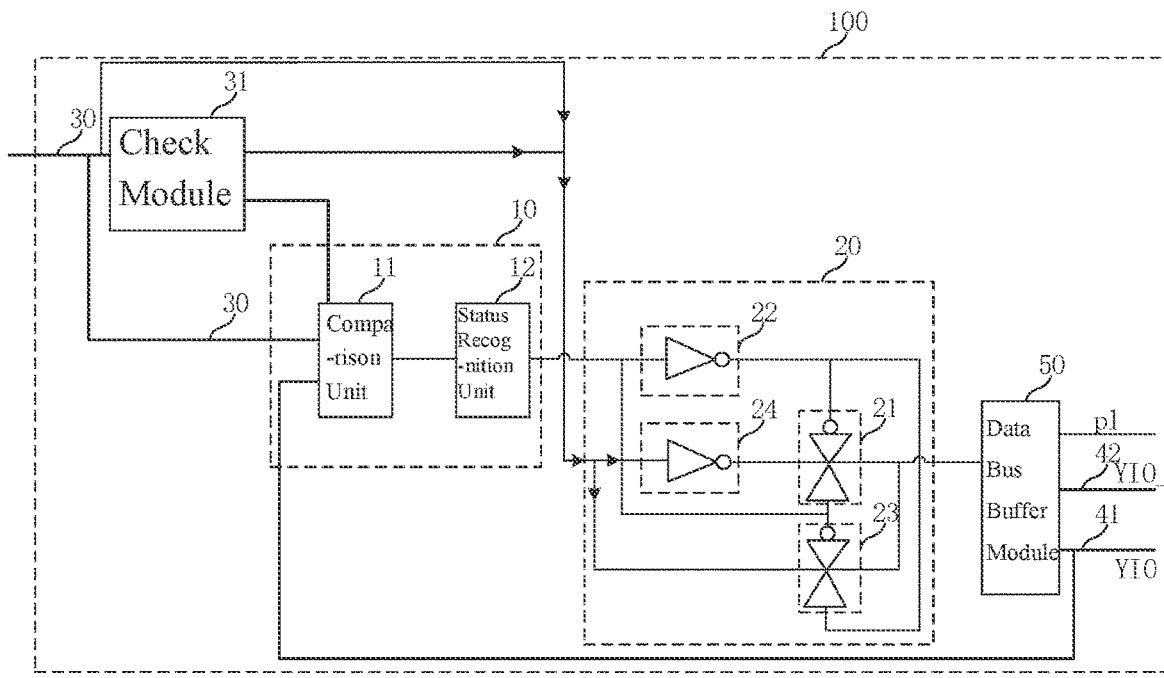

As an example, referring to FIG. 5A and FIG. 5B, in one embodiment of the present disclosure, the data conversion circuit 20 includes a first transmission subcircuit 21, a first phase inversion subcircuit 22, a second transmission subcircuit 23, and a second phase inversion subcircuit 24. The first transmission subcircuit 21 is electrically connected to the check circuit 31, the first data line 30 and the second data line 40, and is electrically connected to an output terminal of the status recognition subcircuit 12 by means of the first phase inversion subcircuit 22. The first transmission subcircuit 21 is configured to transmit the second data to the second data line 40 when the comparison result is indicative of not exceeding the preset threshold, wherein the preset threshold is half of the preset bit width. The second transmission subcircuit 23 is electrically connected to the second data line 40 and the output terminal of the status recognition subcircuit 12, and is electrically connected to the first data line 30 and the check circuit 31 by means of the second phase inversion subcircuit 24. The second transmission subcircuit 23 is configured to invert the second data and transmit the inverted second data to the second data line 40 when the comparison result is indicative of exceeding the preset threshold.

Figure 6:
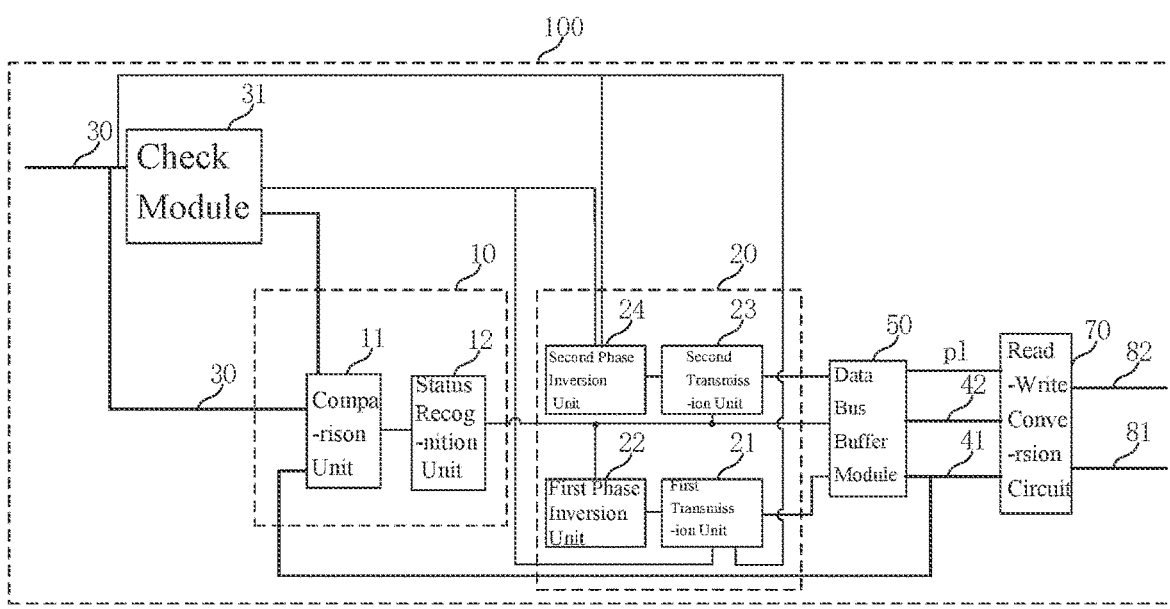
FIG. 6 is a schematic diagram showing a circuit principle of a data transmission circuit according to a sixth embodiment of the present disclosure.

Referring to FIG. 6, in one embodiment of the present disclosure, the data transmission circuit 100 further includes a read-write conversion circuit 70. The read-write conversion circuit 70 is configured to generate fourth data according to the data polarity identification signal pl and the data on the second data line 40, and transmit the fourth data to a third data line 80. The fourth data are generated by means of the read-write conversion circuit 70 according to the data polarity identification signal pl and the data on the second data line 40, thereby ensuring the accuracy of writing the data to the storage array region.

As an example, with continued reference to FIG. 6, the third data line 80 includes a local data line 81 and a complementary local data line 82, wherein the local data line 81 and the complementary local data line 82 are configured to transmit signals mutually inverted in phase. Cross reference may be made to data transmitted by the local data line 81 and data transmitted by the complementary local data line 82, to further improve the accuracy of transmitting the data to a next-stage circuit.

Figure 7:
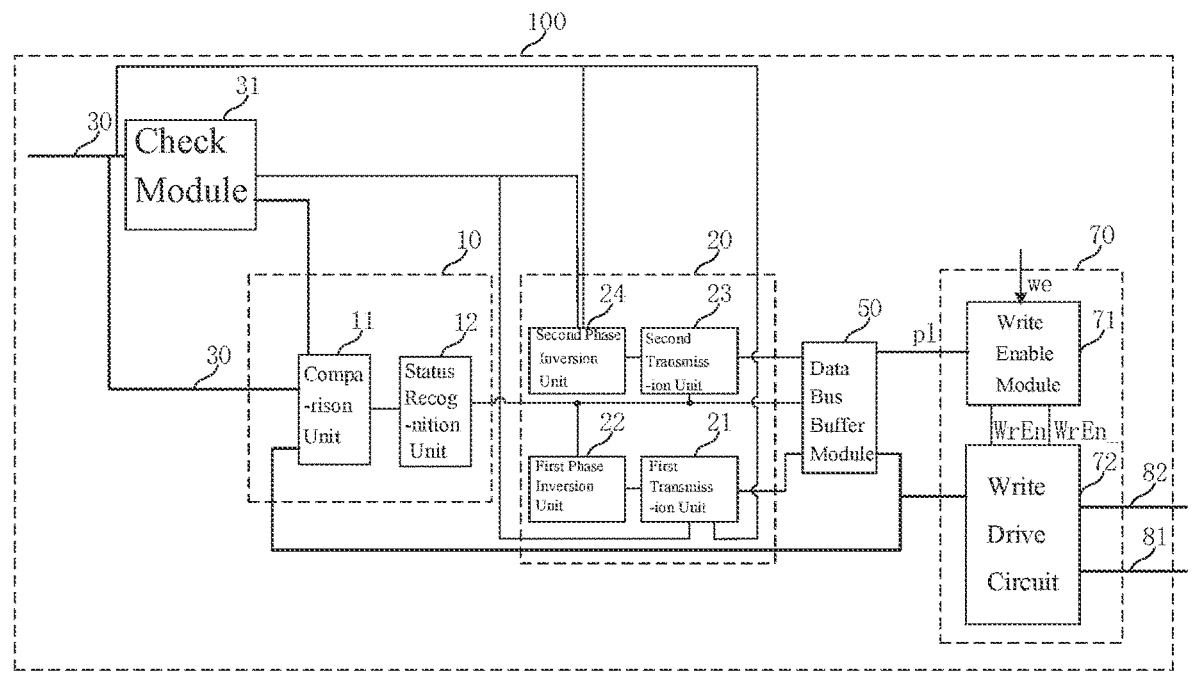
FIG. 7 is a schematic diagram showing a circuit principle of a data transmission circuit according to a seventh embodiment of the present disclosure.

Referring to FIG. 7, in one embodiment of the present disclosure, the read-write conversion circuit 70 includes a write enable circuit 71 and a write drive circuit 72. The write enable circuit 71 is configured to generate a write enable signal WrEn and a write enable inverted signal WrEn_ according to the data polarity identification signal pl and an initial write enable signal we. The write drive circuit 72 is configured to generate the fourth data according to the write enable signal WrEn, the write enable inverted signal WrEn_, and the data on the second data line 40.

Figure 8:
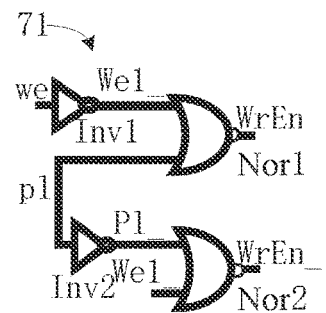
FIG. 8 is a schematic circuit diagram of a write enable circuit in a data transmission circuit according to an embodiment of the present disclosure.

As an example, with reference to FIG. 8, in one embodiment of the present disclosure, the write enable circuit 71 comprises a first inverter Inv1, a first NOR gate Nor1, a second inverter Inv2, and a second NOR gate Nor2. An input terminal of the first inverter Inv1 is electrically connected to the initial write enable signal we, and an output terminal of the first inverter Inv1 is configured to output a first write enable inverted signal Wel_. An input terminal of the first NOR gate Nor1 is electrically connected to the data polarity identification signal pl and the output terminal of the first inverter Inv1, and an output terminal of the first NOR gate Nor1 is configured to output the write enable signal WrEn. An input terminal of the second inverter Inv2 is electrically connected to the data polarity identification signal pl, and an output terminal of the second inverter Inv2 is configured to output a data polarity identification inverted signal P1_. An input terminal of the second NOR gate Nor2 is electrically connected to the output terminal of the second inverter Inv2 and the output terminal of the first inverter Inv1, and an output terminal of the second NOR gate Nor2 is configured to output the write enable inverted signal WrEn_. According to the write enable signal WrEn and the write enable inverted signal WrEn_, the write drive circuit 72 is controlled to generate the fourth data based on the data on the second data line 40, and transmit the fourth data to the third data line 80 such as a local data line LIO or a complementary local data line LIO, to ensure the data transmission accuracy. The local data line LIO and the complementary local data line LIO_ are configured to transmit signals mutually inverted in phase. Cross reference may be made to data transmitted by the local data line LIO and data transmitted by the complementary local data line LIO, to further improve the accuracy of transmitting the data to a next-stage circuit.

Figure 9:
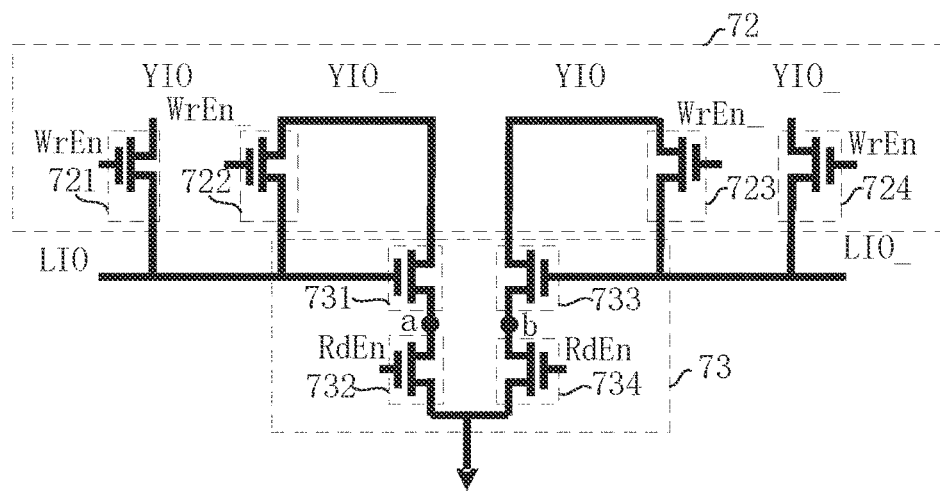
FIG. 9 is a schematic circuit diagram of a write drive circuit in a data transmission circuit according to an embodiment of the present disclosure.

As an example, with reference to FIG. 9, in one embodiment of the present disclosure, the write drive circuit 72 comprises a first switch subcircuit 721, a second switch subcircuit 722, a third switch subcircuit 723, and a fourth switch subcircuit 724. The first switch subcircuit 721 is configured to electrically connect the local data line LIO and the global data line YIO according to the write enable signal WrEn. The second switch subcircuit 722 is configured to electrically connect the local data line LIO and the complementary global data line YIO_ according to the write enable inverted signal WrEn_. The third switch subcircuit 723 is configured to electrically connect the complementary local data line LIO and the global data line YIO according to the write enable inverted signal WrEn_. The fourth switch subcircuit 724 is configured to electrically connect the complementary local data line LIO and the complementary global data line YIO_ according to the write enable signal WrEn. In this way, recovery of data transmission is implemented, and accuracy of data transmission is ensured.

As an example, with continued reference to FIG. 9, in one embodiment of the present disclosure, the read-write conversion circuit 70 further comprises a read drive circuit 73, wherein the read drive circuit 73 comprises a fifth switch subcircuit 731, a sixth switch subcircuit 732, a seventh switch subcircuit 733, and an eighth switch subcircuit 734. A control terminal of the fifth switch subcircuit 731 is electrically connected to the local data line LIO, and is configured to electrically connect the complementary global data line YIO_ and a first node a according to a control terminal signal. The sixth switch subcircuit 732 is configured to electrically connect the first node a and a ground terminal according to the read enable signal. A control terminal of the seventh switch subcircuit 733 is electrically connected to the complementary local data line LIO_, and is configured to electrically connect the global data line YIO and a second node b according to the control terminal signal. The eighth switch subcircuit 734 is configured to electrically connect the second node b and the ground terminal according to the read enable signal. In this embodiment, by reducing the number of data inversions in the process of data transmission, it can be effectively reduced the power consumption in the process of writing data to the local data line LIO or the complementary local data line LIO via the data bus, the global data line YIO or the complementary global data line YIO.

In one embodiment of the present disclosure, there is provided a storage apparatus 200, which comprises the data transmission circuit 100 according to any one of the above embodiments of the present disclosure, wherein the data storage apparatus 200 is configured to store and transmit data of a read operation or a write operation.

Reference may be made to limitations on the data transmission circuit 100 hereinabove for limitations on the storage apparatus 200 in the foregoing embodiment, and thus detailed description of the limitations on the storage apparatus 200 is omitted herein.

It is to be noted that lines in the drawings of this embodiment are all schematic diagrams of connection relationships, and may be multibit connections. In the meantime, the "electrical connection" referred to in this embodiment may mean direct connection or indirect connection, such as connection through a buffer.

Figure 10:
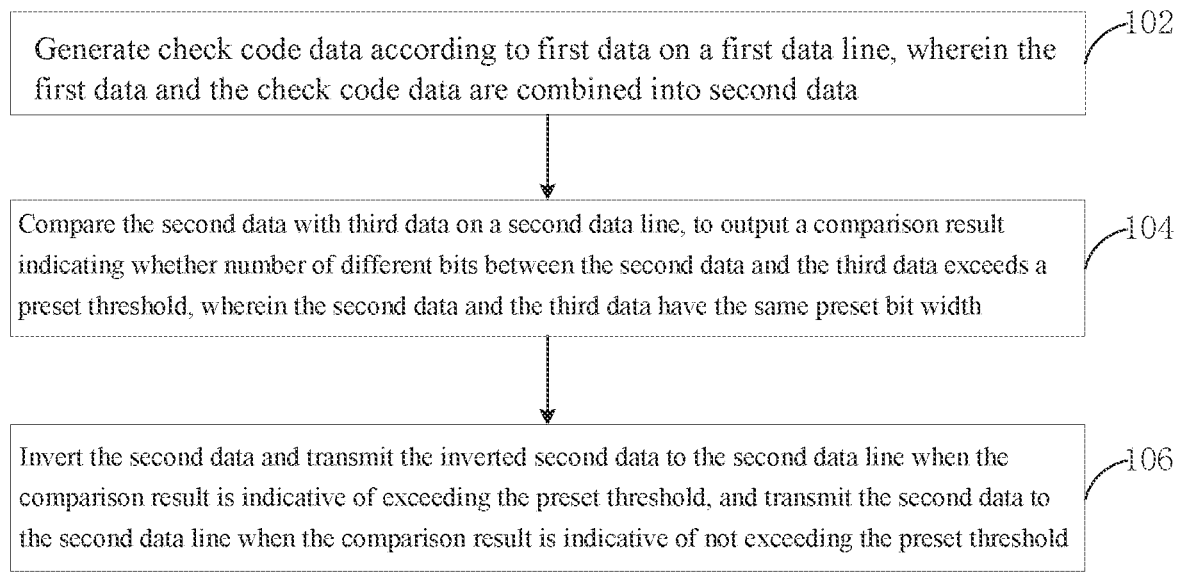
FIG. 10 is a schematic flow diagram of a data transmission method according to an embodiment of the present disclosure.

Further, with reference to FIG. 10, in one embodiment of the present disclosure, there is provided a data transmission method, comprising:

Step 102: generating check code data according to first data on a first data line, wherein the first data and the check code data are combined into second data;

Step 104: comparing the second data with third data on a second data line, to output a comparison result indicating whether number of different bits between the second data and the third data exceeds a preset threshold, wherein the second data and the third data have the same preset bit width; and Step 106: inverting the second data and transmitting the inverted second data to the second data line when the comparison result is indicative of exceeding the preset threshold, and transmitting the second data to the second data line when the comparison result is indicative of not exceeding the preset threshold.

In some embodiments, with continued reference to FIG. 10, the first data on the first data line are checked to generate the check code data, the first data and the check code data are combined into the second data, and the second data are transmitted to a next-level data line. Next, the second data are compared with the third data on the second data line to output a comparison result indicating whether number of different bits between the second data and the third data exceeds a preset threshold, wherein the second data and the third data have the same preset bit width. The second data are inverted and the inverted second data are transmitted to the second data line when the comparison result is indicative of exceeding the preset threshold, and the second data are transmitted to the second data line when the comparison result is indicative of not exceeding the preset threshold, wherein the preset threshold may be set to half of the preset bit width. The transmitted data generally include a data string comprising 0 and 1, in this embodiment, by applying this power-saving algorithm into a data transmission process, number of inversions of written data can be reduced while transmission accuracy of the written data is ensured, which can effectively reduce the power consumption in the data transmission process. Therefore, the data transmission accuracy can be improved while reducing the power consumption in a data writing process without changing a data transmission path length. In this embodiment, before this power-saving algorithm is applied, the first data on the first data line are prechecked and check code data are generated, and subsequently the check code data are stored in a memory cell, such that data are checked when the data are to be read, to prevent adverse effects caused by data errors occurring when the second data are inverted in the process of using this power-saving algorithm. In this way, reliability in the data writing process or data storage process can also be ensured while reducing the power consumption.

In one embodiment, the preset threshold is half of the bit width of the second data. The method further includes:

Step 108: generating a data polarity identification signal according to the comparison result, and generating fourth data according to the data polarity identification signal and the data on the second data line, to transmit the fourth data to a third data line.

Figure 11:
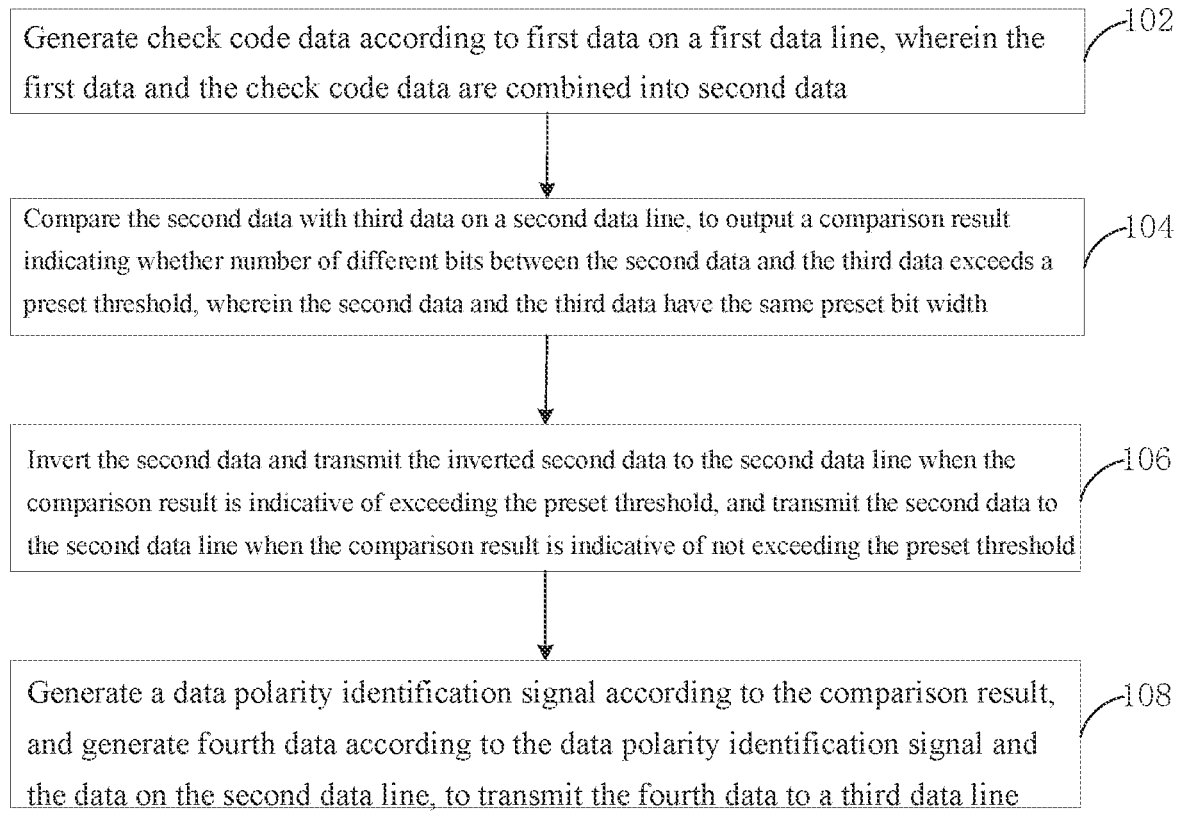
FIG. 11 is a schematic flow diagram of a data transmission method according to another embodiment of the present disclosure.

In some embodiments, with continued reference to FIG. 11, the third data line may include a local data line LIO and a complementary local data line LIO_, wherein the local data line LIO and the complementary local data line LIO_ are configured to transmit signals mutually inverted in phase, such that cross reference may be made to data transmitted by the local data line LIO and data transmitted by the complementary local data line LIO_, to improve the data transmission accuracy. The second data line may include a global data line YIO and a complementary global data line YIO_, wherein the global data line YIO and the complementary global data line YIO_ are configured to transmit signals mutually inverted in phase, such that cross reference may be made to data transmitted by the global data line YIO and data transmitted by the complementary global data line YIO_, to improve the data transmission accuracy. The third data on the global data line YIO may be inverted and the inverted third data may be transmitted to the local data line LIO when the comparison result indicated by the data polarity identification signal is indicative of exceeding the preset threshold, and the third data on the global data line YIO may be transmitted to the local data line LIO when the comparison result indicated by the data polarity identification signal is indicative of not exceeding the preset threshold, to restore the previously inverted data and ensure the accuracy of transmitting the data to a next-stage circuit.

In one embodiment of the present disclosure, there is provided a computer-readable storage medium, storing a computer program thereon. The computer program is executable by a processor, whereby the data transmission method according to any one of the above embodiments of the present disclosure is implemented.

It should be understood that although the various steps in the flowcharts of FIG. 10 and FIG. 11 are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least some of the steps in FIG. 10 and FIG. 11 may include a plurality of sub-steps or a plurality of stages, which are not necessarily performed at the same moment, but may be executed at different moments, and the order of execution of these sub-steps or stages is not necessarily performed sequentially, but may be performed alternately or alternately with at least a portion of the sub-steps or stages of other steps or other steps.

Those of ordinary skill in the art may understand that implementation of all or some flows in the method according to the foregoing embodiments may be achieved by instructing relevant hardware by a computer program, wherein the computer program may be stored in a non-transitory computer-readable storage medium, and when the computer program is executed, the flows of the embodiments of the foregoing methods may be included. Any reference to memory, storage, database or other media used in the embodiments provided in the present disclosure may include nonvolatile and/or volatile memory. The nonvolatile memory may include a read-only memory (ROM), a programmable ROM (PROM), an electrically programmable read-only memory ROM (EPROM), an electrically erasable programmable ROM (EEPROM) or a flash memory. The volatile memory may include a random access memory (RAM) or an external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronization link (Synchlink) DRAM (SLDRAM), and Rambus dynamic RAM (RDRAM), etc.

It is to be noted that the above embodiments are intended for purposes of illustration only and are not intended to limit the present disclosure.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A data transmission circuit, comprising:
   a check circuit configured to generate check code data according to first data on a first data line, and combine the first data and the check code data into second data;
   a comparison circuit electrically connected to the first data line, the check circuit and a second data line, the comparison circuit being configured to receive the second data and third data on the second data line, and compare the second data with the third data to output a comparison result indicating whether number of different bits between the second data and the third data exceeds a preset threshold, wherein the second data and the third data have a same preset bit width; and
   a data conversion circuit electrically connected to the check circuit, the comparison circuit and the second data line, the data conversion circuit being configured to invert the second data and transmit an inverted second data to the second data line when the comparison result is indicative of exceeding the preset threshold; and the data conversion circuit being further configured to transmit the second data to the second data line when the comparison result is indicative of not exceeding the preset threshold.

2. The data transmission circuit according to claim 1, further comprising:
   a data bus buffer circuit electrically connected to the data conversion circuit, the comparison circuit and the second data line, the data bus buffer circuit being configured to generate a data polarity identification signal according to the comparison result and to transmit the second data or the inverted second data to the second data line.

3. The data transmission circuit according to claim 2, wherein the second data line comprises a global data line and a complementary global data line, the global data line and the complementary global data line being configured to transmit signals mutually inverted in phase;
   the inverting the second data and transmitting the inverted second data to the second data line comprises:
   inverting the second data and transmitting the inverted second data to the global data line; and
   the transmitting the second data to the second data line comprises:
   transmitting the second data to the global data line.

4. The data transmission circuit according to claim 1, wherein the comparison circuit comprises:
   a comparison subcircuit configured to compare the second data and the third data bit by bit, and output comparison status data of each bit; and
   a status recognition subcircuit electrically connected to the comparison subcircuit, the status recognition subcircuit being configured to perform statistics on the comparison status data of each bit, and output the comparison result according to a statistical result.

5. The data transmission circuit according to claim 4, wherein the data conversion circuit comprises:
   a first transmission subcircuit electrically connected to the first data line, the check circuit and the second data line and electrically connected to an output terminal of the status recognition subcircuit by means of a first phase inversion subcircuit, the first transmission subcircuit being configured to transmit the second data to the second data line when the comparison result is indicative of not exceeding the preset threshold, the preset threshold being half of the preset bit width; and
   a second transmission subcircuit electrically connected to the second data line and the output terminal of the status recognition subcircuit and electrically connected to the first data line and the check circuit by means of a second phase inversion subcircuit, the second transmission subcircuit being configured to invert the second data and transmit the inverted second data to the second data line when the comparison result is indicative of exceeding the preset threshold.

6. The data transmission circuit according to claim 2, further comprising a read-write conversion circuit, wherein the read-write conversion circuit is configured to generate fourth data according to the data polarity identification signal and the data on the second data line, and transmit the fourth data to a third data line.

7. The data transmission circuit according to claim 6, wherein the third data line comprises a local data line and a complementary local data line, the local data line and the complementary local data line being configured to transmit signals mutually inverted in phase.

8. The data transmission circuit according to claim 7, wherein the read-write conversion circuit comprises:
a write enable circuit configured to generate a write enable signal and a write enable inverted signal according to the data polarity identification signal and an initial write enable signal; and
a write drive circuit configured to generate the fourth data according to the write enable signal, the write enable inverted signal, and data on the second data line.

9. The data transmission circuit according to claim 8, wherein the write enable circuit comprises:
a first inverter, an input terminal of the first inverter being electrically connected to the initial write enable signal, and an output terminal of the first inverter being configured to output a first write enable inverted signal;
a first NOR gate, an input terminal of the first NOR gate being electrically connected to the data polarity identification signal and the output terminal of the first inverter, and an output terminal of the first NOR gate being configured to output a write enable signal;
a second inverter, an input terminal of the second inverter being electrically connected to the data polarity identification signal, and an output terminal of the second inverter being configured to output a data polarity identification inverted signal; and
a second NOR gate, an input terminal of the second NOR gate being electrically connected to the output terminal of the second inverter and the output terminal of the first inverter, and an output terminal of the second NOR gate being configured to output the write enable inverted signal.

10. The data transmission circuit according to claim 9, wherein the write drive circuit comprises:
a first switch subcircuit configured to electrically connect the local data line and a global data line according to the write enable signal;
a second switch subcircuit configured to electrically connect the local data line and a complementary global data line according to the write enable inverted signal;
a third switch subcircuit configured to electrically connect the complementary local data line and the global data line according to the write enable inverted signal; and
a fourth switch subcircuit configured to electrically connect the complementary local data line and the complementary global data line according to the write enable signal.

11. The data transmission circuit according to claim 10, wherein the read-write conversion circuit further comprises a read drive circuit, the read drive circuit comprising:

a fifth switch subcircuit, a control terminal of the fifth switch subcircuit being electrically connected to the local data line, the fifth switch subcircuit being configured to electrically connect the complementary global data line and a first node according to a control terminal signal;
a sixth switch subcircuit configured to electrically connect the first node and a ground terminal according to the read enable signal;
a seventh switch subcircuit, a control terminal of the seventh switch subcircuit being electrically connected to the complementary local data line, the seventh switch subcircuit being configured to electrically connect the global data line and a second node according to the control terminal signal; and
an eighth switch subcircuit configured to electrically connect the second node and the ground terminal according to the read enable signal.

12. The data transmission circuit according to claim 1, wherein the check circuit comprises an error correction coding (ECC) subcircuit.

13. A storage apparatus comprising a data transmission circuit, wherein the storage apparatus is configured to store and transmit data of a read operation or a write operation;
wherein the data transmission circuit comprises:
a check circuit configured to generate check code data according to first data on a first data line, and combine the first data and the check code data into second data;
a comparison circuit electrically connected to the first data line, the check circuit and a second data line, the comparison circuit being configured to receive the second data and third data on the second data line, and compare the second data with the third data to output a comparison result indicating whether number of different bits between the second data and the third data exceeds a preset threshold, wherein the second data and the third data have a same preset bit width; and
a data conversion circuit electrically connected to the check circuit, the comparison circuit and the second data line, the data conversion circuit being configured to invert the second data and transmit an inverted second data to the second data line when the comparison result is indicative of exceeding the preset threshold; and the data conversion circuit being further configured to transmit the second data to the second data line when the comparison result is indicative of not exceeding the preset threshold.

14. A data transmission method, comprising:
generating check code data according to first data on a first data line, wherein the first data and the check code data are combined into second data;
comparing second data with third data on a second data line, to output a comparison result indicating whether number of different bits between the second data and the third data exceeds a preset threshold, wherein the second data and the third data have a same preset bit width; and
inverting the second data and transmitting an inverted second data to the second data line when the comparison result is indicative of exceeding the preset threshold, and transmitting the second data to the second data line when the comparison result is indicative of not exceeding the preset threshold.

15. The data transmission method according to claim 14, wherein the preset threshold is half of bit width of the second data, the method further comprising:

generating a data polarity identification signal according to the comparison result, and generating fourth data according to the data polarity identification signal and data on the second data line, to transmit the fourth data to a third data line.

* * * * *